US006784300B2

(12) United States Patent
Cetin et al.

(10) Patent No.: US 6,784,300 B2
(45) Date of Patent: Aug. 31, 2004

(54) HOLOGRAPHIC STORAGE MEDIUM COMPRISING POLYFUNCTIONAL EPOXY MONOMERS CAPABLE OF UNDERGOING CATIONIC POLYMERIZATION

(75) Inventors: Erdem A. Cetin, Waltham, MA (US); Richard A. Minns, Arlington, MA (US); David A. Waldman, Concord, MA (US)

(73) Assignee: Aprilis, Inc., Maynard, MA (US)

( * ) Notice: Subject to any disclaimer, the term of this patent is extended or adjusted under 35 U.S.C. 154(b) by 195 days.

(21) Appl. No.: 09/941,166

(22) Filed: Aug. 28, 2001

(65) Prior Publication Data

US 2002/0068223 A1 Jun. 6, 2002

Related U.S. Application Data

(60) Provisional application No. 60/228,121, filed on Aug. 28, 2000.

(51) Int. Cl.$^7$ .................. C07D 303/02; G03H 1/02; G03H 1/04
(52) U.S. Cl. .................. 549/215; 549/214; 549/546; 549/547; 556/415; 556/434; 556/436; 556/439; 556/449; 430/1; 430/2; 430/286.1
(58) Field of Search .................. 549/215, 214, 549/546, 547; 556/415, 434, 436, 439, 449; 430/1, 2, 286.1

(56) References Cited

U.S. PATENT DOCUMENTS

| | | | |
|---|---|---|---|
| 5,037,861 A | 8/1991 | Crivello et al. | 522/172 |
| 5,484,950 A | 1/1996 | Crivello | 549/215 |
| 5,759,721 A | 6/1998 | Dhal et al. | 430/1 |
| 5,874,187 A | 2/1999 | Colvin et al. | 430/2 |
| 6,165,648 A | 12/2000 | Colvin et al. | 430/1 |

FOREIGN PATENT DOCUMENTS

| | | |
|---|---|---|
| EP | 0824222 | 2/1998 |
| WO | WO 97/13183 | 4/1997 |
| WO | WO 98/22521 | 5/1998 |
| WO | WO 98/33645 | 8/1998 |
| WO | WO 99/26112 | 5/1999 |
| WO | WO 01/53385 | 7/2001 |
| WO | WO 01/90817 | 11/2001 |

OTHER PUBLICATIONS

Crivello, et al., "Regioselective Hydrosilations. I. The Hydrosilation of α,ω– Dihyrogen Functional Oligopolydimethylsiloxanes with 3–Vinyl–7–oxabicyclo[4.1.0]heptane," *J Polym Sci, Part A: Poly Chem*, 1993, 31(10), 2563–2572.

Crivello, et al., "The Synthesis of Novel Silicon–Containing Epoxy Monomers and Oligomers," *Polymer Preprints*(Am Chem Soc, Div Polym Chem), 1991, 32(3), 173–174.

Crivello, et al., "Synthesis and Polymerization of Novel Cationically Polymerizable Monomers," *J Macromol Sci– Pure and Applied Chemistry*, 1994, A31(8), 1001–1029.

Crivello, et al., "The Synthesis and Cationic Polymerization of Multifunctional Silicon–Containing Epoxy Monomers and Oligomers," *J Polym Sci, Part A: Poly Chem*, 1994, 32(4), 683–697.

Crivello, et al., "The Synthesis, Characterization, and Photoinitiated Cationic Polymerization of Silicon–Containing Epoxy Resins," *J Polym Sci, Part A: Poly Chem*, 1990, 28(3), 479–503.

Crivello, et al., "Regioselective Ring–Opening Polymerizations and Hydrosilyations Catalyzed by Transition Metal Complexes," *Polymer Preprints* (Am Chem Soc, Div Polym Chem), 1991, 32(1), 340–341.

Crivello, et al., "Regioselective Rhodium–Containing Catalysts for Ring–Opening Polymerizations and Hydrosilylations," *J Polym Sci, Part A: Poly Chem*, 1992, 30(1), 1–11.

*Primary Examiner*—Ba K. Trinh
(74) *Attorney, Agent, or Firm*—Hamilton, Brook, Smith & Reynolds, P.C.

(57) ABSTRACT

Disclosed is a holographic recording medium. The novel holographic recording mediums disclosed herein comprises: a) at least one polyfunctional epoxide monomer or oligomer which undergoes acid initiated cationic polymerization. Each epoxide in the monomer or oligomer is linked by group comprising a siloxane to a silicon atom and each monomer or oligomer has an epoxy equivalent weight of greater than about 300 grams/mole epoxide; b) a binder which is capable of supporting cationic polymerization; c) an acid generator capable of producing an acid upon exposure to actinic radiation; and optionally d) a sensitizer.

28 Claims, No Drawings

HOLOGRAPHIC STORAGE MEDIUM COMPRISING POLYFUNCTIONAL EPOXY MONOMERS CAPABLE OF UNDERGOING CATIONIC POLYMERIZATION

RELATED APPLICATION

This application claims the benefit of U.S. Provisional Application No. 60/228,121, filed on Aug. 28, 2000. The entire teachings of the above application are incorporated herein by reference.

GOVERNMENT FUNDING

The invention was supported, in whole or in part, by grant MDA972-94-2-0008 from the Defense Advanced Research Projects Agency. The government has certain rights in the invention.

BACKGROUND OF THE INVENTION

This invention relates to a holographic recording medium and to the composition of this medium which provides for a condition of low volume shrinkage, good recording sensitivity, and high dynamic range.

In prior art processes for formation of volume-phase holograms, data is stored as holograms resulting from the interference of signal and reference beams within a holographic recording medium comprising a homogenous mixture of at least one polymerizable monomer or oligomer and a polymeric binder; the polymerizable monomer or oligomer must of course be sensitive or sensitized to the radiation used to form the interference fringes. In the illuminated regions of the interference pattern, the monomer or oligomer undergoes polymerization to form a polymer that has a refractive index different from that of the binder. Diffusion of the monomer or oligomer into the illuminated regions, with consequent chemical segregation of binder from these areas and alteration in its concentration in the non-illuminated regions, produces spatial separation between the polymer formed from the monomer or oligomer and the binder, thereby providing the refractive index modulation needed to form a hologram. Typically, after the holographic exposure, a post-imaging blanket exposure of the medium to actinic radiation is required to complete the polymerization of the monomer or oligomer and fix the hologram. When holograms are multiplexed co-locationally, such as by multiple holographic exposures at different angle conditions, a post-imaging blanket exposure of the medium to actinic radiation may also be required to complete the polymerization of the monomer or oligomer and fix the multiplexed holograms.

One important potential use of volume holograms is in digital data storage; the three dimensional nature of a volume hologram, which refers to the storage of each bit as a hologram extending throughout the entire volume of the recording medium, renders volume holograms suitable for use in high capacity digital data storage. A group of bits can be encoded and decoded together as a two dimensional array of bits referred to as a page. Various multiplexing methods, such as angular, spatioangular, shift, wavelength, phase-code, and related methods, are used to store multiple pages co-locationally within the same volume or in partially overlapping volumes.

Photopolymerizable holographic recording media for write-once-read-many (WORM) data storage applications should ideally exhibit pre-recording shelf life of at least a year, good recording sensitivity, high degree of optical homogeneity (i.e. low scattering), uniform recording characteristics, stable image fidelity, and low volume shrinkage coupled with high dynamic range or cumulative grating strength. Low volume shrinkage coupled with good dynamic range and recording sensitivity, however, remains as one of the most difficult to achieve performance characteristics for photopolymerizable holographic recording media that are designed for data storage applications. Typically, high dynamic range is achievable with photopolymer recording materials but the resultant volume shrinkage is significant and thus poor image fidelity and poor signal to noise results. Uh-Sock Rhee et al. in Applied Optics, 34, 5, 846 (1995) describe the shrinkage effect in Dupont HRF-150-38 photopolymer as a function of increasing exposure. This material comprises monomers that are photopolymerized using conventional free radical polymerization chemistry. The magnitude of the deviation of the Bragg angle, displayed in FIGS. 6 and 7 of the above reference, is about 2.5°. This value is five times larger than the full width at half maximum (FWHM) of the Bragg peak for a plane-wave hologram with a grating period in the intermediate range of a digital page based image, and which is recorded in a medium thickness of only 100 $\mu$m. Accordingly, even for such a thin recording medium, which is not sufficiently thick for a holographic data storage medium, the angle shift from the recording condition exhibited by the Dupont HRF-150-38 material is so large that no diffraction efficiency is observed at the recording angle condition, and thus an image could not be reconstructed without substantially tuning the angle of the read beam. Tuning the angle of the read beam is not desirable for a holographic data storage system since this imposes significant overhead on the readout design and would seriously impair data rates. Furthermore, a single tuning adjustment would be inadequate to read an image affected by such levels of shrinkage, since page based images comprise a continuum of plane-wave grating components with a range of grating angles. Contributions to an image from larger grating angle components would be shifted further in angle from the Bragg condition than for smaller grating angle components, and thus differential tuning would be required to reconstruct the high and low frequency features of an image. For thicker recording media this problem is exacerbated further due to the inverse proportionality of FWHM on media thickness.

A consequence of high volume shrinkage is the requirement to use up a portion of the reactive monomeric or oligomeric species in the recording medium before holographic recording of information can be implemented with reasonable fidelity. This step has the effect of diminishing the usable dynamic range as well as causing significant decline in recording sensitivity. An example of this tradeoff is the photopolymer material developed by Lucent Technologies, and which is based upon conventional free radical polymerization chemistry. By way of example, this material comprises difunctional acrylate oligomers and monomers such as N-vinyl carbazole and isobornyl acrylate (see Dhar et al. in Optics Letters, 23, 21, 1710 (1998), all of which exhibit significant volume shrinkage upon polymerization. Accordingly, Dhar et al. describe that if more than twenty 480-kbit images are recorded co-locationally in this material, for either 250 or 500 $\mu$m thick media, then the raw bit-error rate (BER) rises above the desired upper limit value of 5e-3. This occurs due to excessive volume shrinkage, which firstly reduces image fidelity and secondly causes an increased degree of Bragg detuning as the extent of polymerization increases. In Optics Letters, 24, 7, 487 (1999), Dhar et al. describe a photopolymer recording media that exhibits moderate dynamic range per unit thickness but which suffers from significant volume shrinkage. Accordingly, Dhar et al. show that the cumulative grating strength for a material that exhibits 0.5% transverse shrinkage declines by a factor of about 4 to 5 when the concentration of monomer is reduced in order to achieve an improved and minimally desirable value of 0.2% transverse shrinkage. Consequently, for 200 μm thick media Dhar describes that the cumulative grating strength diminishes from about 9 to about 2, an unacceptably low value, when a preconditioning step is used to consume a portion of the monomeric species in order to reduce shrinkage during holographic recording. Additionally, the recording sensitivity of the recording material declines when the monomer concentration is reduced to compensate for shrinkage, as the physical state of the material during recording more closely resembles a glassy polymer in which diffusion rates are substantially reduced. Accordingly, despite Dhar et al. having prepared such materials with increased thicknesses, up to about 1 mm, in order to compensate for the serious decrease in dynamic range exhibited at acceptable levels of transverse shrinkage, the recording sensitivity was still low. When holographic recording media are prepared with increased media thickness, however, then the degree of Bragg detuning, exhibited for any given level of transverse shrinkage, becomes more problematic as a result of the concomitant diminution in the peak width of the Bragg selectivity angular profile. In particular, when the magnitude of Bragg detuning is large relative to the Bragg selectivity peak width, then the observed diffraction efficiency is substantially lower than the value at the Bragg peak, and thus the raw BER of a reconstructed image increases significantly as a result of decreased signal to noise ratio.

In prior art, holographic recording media based upon cationic ring opening polymerization have employed monomers which when homopolymerized produce hard and brittle polymers due to high crosslink density. High crosslink density can act to inhibit attainment of significant extents of polymerization reaction. This is particularly the case for multifunctional moieties where enthalpy values for homopolymerizations can be less than about 50 (kJ/mole epoxide). Previous compositions comprising such multifunctional monomers are described by way of example in U.S. Pat. No. 5,759,721 and in U.S. patent application Ser. No. 08-970, 066. Although these monomers exhibit considerably reduced shrinkage upon polymerization, as compared to other monomers such as acrylates, the remaining shrinkage coupled with their relatively unyielding mechanical properties can cause both mechanical and optical difficulties when employed in holographic recording media with thickness of 200 μm or greater. Additionally, inhibition of significant extents of polymerization reaction due to high crosslink density prevents attainment of the full dynamic range of the photopolymerizable medium during holographic recording.

SUMMARY OF THE INVENTION

It has now been found that multifunctional epoxide monomers with an epoxy equivalent weight greater than 300 grams per mole of epoxide are suitable for use in holographic recording materials. It has also been found that holographic recording materials comprising certain of these multifunctional epoxide monomers exhibit significantly decreased shrinkage, cracking and brittleness compared with the holographic recording materials of the prior art (Examples 6 and 7). Based on these discoveries, novel multifunctional epoxide monomers, novel holographic recording materials and methods of preparing these novel holographic recording materials are disclosed herein.

One embodiment of the present invention is a holographic recording medium comprising a binder capable of supporting cationic polymerization, an acid generator capable of producing an acid upon exposure to actinic radiation, and a multifunctional epoxide monomer capable of undergoing cationic polymerization and which has an epoxy equivalent weight greater than about 300 (grams/mole epoxide). As discussed below, certain acid generators also require sensitizers. Preferably, the holographic recording medium additionally comprises a difunctional and/or a monofunctional epoxide monomer capable of undergoing cationic polymerization. Optionally, the monofunctional and difunctional monomer have an epoxy equivalent weight less than about 225 (grams/mole epoxide). The holographic medium of the present invention is preferably essentially free from materials capable of undergoing free radical polymerization.

Another embodiment of the present invention is a multifunctional epoxide monomer that undergoes acid initiated cationic polymerization. Each epoxide in the monomer is linked by a group comprising a siloxane to a central silicon atom or alternatively in linked to a central polysiloxane ring, and each monomer and oligomer has an epoxy equivalent weight of greater than about 300 grams/mole epoxide and preferably less than about 1000 grams/mole epoxide. More preferably, the monomer has an epoxy equivalent weight between about 300 and about 700 grams/mole epoxide.

Another embodiment of the present invention is a mixture comprising a binder capable of supporting cationic polymerization and a multifunctional epoxide monomer capable of undergoing cationic polymerization and which has an epoxy equivalent weight greater than about 300 grams/mole epoxide. Preferably, the mixture additionally comprises a difunctional and/or monofunctional epoxide monomer capable of undergoing cationic polymerization and which preferably have an epoxy equivalent weight less than about 225 (grams/mole epoxide). This mixture can be used in the preparation of the holographic recording materials of the present invention by adding thereto the other components of the medium, as described below.

Yet another embodiment of the present invention is a method of preparing the holographic recording medium of the present invention. The method comprises the step of combining the binder, and multifunctional epoxide monomer(s) having an epoxy equivalent weight greater than about 300 grams/mole epoxide and the acid generator. When present, the sensitizer and the difunctional and/or multifunctional epoxide monomer are also combined therewith. Preferably, the binder and multifunctional epoxide monomer having an epoxy equivalent weight greater than about 300 grams/mole epoxide and, when present, the monofunctional and difunctional monomers are combined before adding the other components.

The large epoxy equivalent weight of the multifunctional epoxide monomers used in the holographic recording materials disclosed herein reduces crosslink density, and accordingly a greater extent of polymerization reaction can be achieved during exposure to actinic radiation. Consequently, increased dynamic range can be attained during holographic recording. In addition, holographic recording materials comprising a number of the disclosed multifunctional epoxide monomers exhibit significantly decreased shrinkage, cracking and brittleness compared with the holographic recording materials of the prior art. The monomers and oligomers described here have the advantage of being compatible with the preferred siloxane binders and of exhibiting enthalpy values for homopolymerization that can exceed 75 (kJ/mole epoxide).

DETAILED DESCRIPTION OF THE INVENTION

Suitable monomers and oligomers for use in the present invention are stable on prolonged storage but capable of undergoing rapid cationic polymerization. They are also miscible with binders used for holographic recording materials. Typically, the monomers and oligomers are siloxanes with epoxy functional groups. The preferred type of epoxy group is a cycloalkene oxide group, especially a cyclohexene oxide group. A "polyfunctional" monomer or oligomer is a compound having at least three groups of the specified functionality, in the present case at least three epoxy groups. The terms "polyfunctional" and "multifunctional" are used interchangeably herein. A "difunctional" monomer or oligomer is a compound having two groups of the specified functionality; and a "monofunctional" monomer or oligomer is a compound having one group of the specified functionality.

Polyfunctional monomers of the present invention typically have three or four epoxides (preferably cyclohexene oxide) groupings connected by a linker through an Si—O group, i.e., a "siloxane group", to a central Si atom. Alternatively, the epoxides are connected by a linker to a central polysiloxane ring. For example, certain polymers and oligomers are represented by Structural Formula (I):

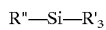
(I).

Each R' in Structural Formula (I) is independently an epoxide substituted aliphatic group connected by an inert linker group comprising a siloxane to the central silicon atom. In one example, R' comprises a group represented by Structural Formula (II):

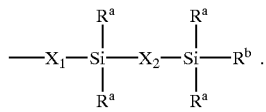
(II)

$X_1$ and $X_2$ are independently an inert linking group. Preferably $X_2$ is —O—.

Each $R^a$ is independently a substituted or unsubstituted aliphatic group or a substituted or unsubstituted aryl group.

Each $R^b$ is an aliphatic group substituted with an epoxide.

R" in structural Formula (I) is R' or —H, a substituted aliphatic group, an unsubstituted aliphatic group, a substituted aryl group, an unsubstituted aryl group, a substituted siloxane group, an unsubstituted siloxane group, a substituted polysiloxane group or an unsubstituted polysiloxane group.

In one preferred embodiment, the polyfunctional monomer is represented by Structural Formula (III):

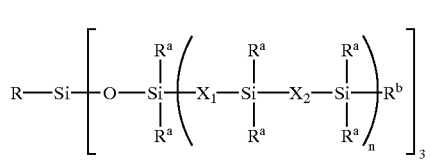
(III)

n is 1, 2, 3 or 4; and R is a substituted or unsubstituted aliphatic group, a substituted or unsubstituted aryl group or is a group represented by Structural Formula (IV) or (V):

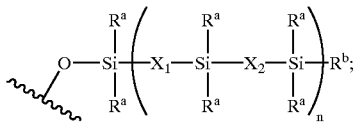
(IV)

or

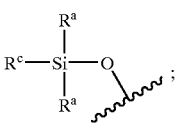
(V)

Each $R^a$, $R^b X_1$ and $X_2$ is as defined above in Structural Formula (II); $R^c$ is H, an unsubstituted aliphatic group, a substituted aliphatic group, an unsubstituted aryl group, a substituted aryl group, a substituted siloxane group, an unsubstituted siloxane group, a substituted polysiloxane group or an unsubstituted polysiloxane group.

One example of a polyfunctional monomer represented by Structural Formula (III) is a monomer represented by Structural Formula (VI):

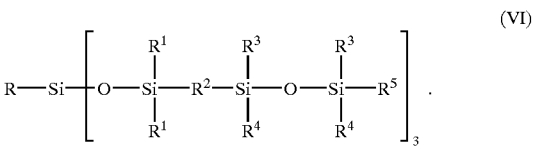
(VI)

R in Structural Formula (VI) is a group represented by Structural Formula (VII) or (VIII).

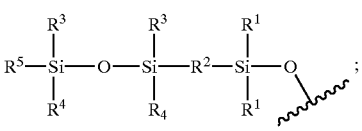
(VII)

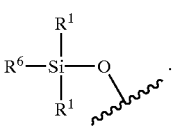
(VIII)

Each group $R^1$, each group $R^3$ and each group $R^4$ is independently a substituted or unsubstituted $C_{1-12}$ alkyl, $C_{1-12}$ cycloalkyl, aryl substituted $C_{1-12}$ alkyl or aryl group.

Each group $R^2$ is independently a substituted or unsubstituted $C_{1-12}$ alkylene, $C_{1-12}$ cycloalkylene, $C_{1-12}$ arylalkylene, or arylene group, —$Y_1$—[O—$Y_1$]$_p$—, —$Y_1$—Si($R^z$)$_2$—$Y_1$—, —$Y_1$—Si($R^z$)$_2$—$Y_1$—O—$Y_1$Si($R^z$)$_2$—$Y_1$—, or —$Y_1$—Si($R^z$)$_2$—$Y_1$—Si($R^z$)$_2$—$Y_1$—.

Each $R^5$ is, independently, an epoxide substituted aliphatic group having 2–10 carbon atoms.

Each group $R^6$ is independently hydrogen, an alkenyl, a substituted or unsubstituted $C_{1-12}$ alkyl, $C_{1-12}$ cycloalkyl, aryl substituted $C_{1-12}$-alkyl or aryl or $R^z$—(O—$Y_1$)$_m$—, ($R^z$)$_3$Si—(O—Si($R^z$)$_2$)$_q$—$Y_1$— or ($R^z$)$_3$Si—(O—Si($R^z$)$_2$)$_q$—O—.

Each $R^z$ is independently a substituted or unsubstituted $C_{1-12}$ alkyl group, $C_{1-12}$ cycloalkyl alkyl group, aryl substituted $C_{1-12}$ alkyl group or aryl group.

Each $Y_1$ is independently a $C_{1-12}$ alkylene group.

p is an integer from 1 to 5 (preferably 1); m is an integer from 1–10 (preferably 1); and q is an integer from 0 to 4 (preferably 0 or 1).

Preferably, $R^2$ is independently a substituted or unsubstituted $C_{1-12}$ alkylene, $C_{1-12}$ cycloalkylene, $C_{1-12}$ arylalkylene, or arylene group; and each $R^6$ is independently a substituted or unsubstituted $C_{1-12}$ alkylsilane, $C_{1-12}$ cycloalkylsilane, $C_{1-12}$ alkoxysilane, aryl substituted $C_{1-12}$ alkylsilane, a hydrogen, a vinyl, a substituted or unsubstituted $C_{1-12}$ alkyl, $C_{1-12}$ dialkylether (alkyl-O-alkylene-), ($C_{1-12}$ cycloalkyl)$C_{1-12}$ alkylether (cycloalkyl-O-alkylene-), $C_{1-12}$ cycloalkyl, aryl substituted $C_{1-12}$ alkyl or aryl group.

Specific monomers of this type are those in which R is a group represented by Structural Formula (VII) or (VII) and wherein each group $R^1$, each group $R^3$ and each group $R^4$ is a methyl group; each group $R^2$ is an ethylene, hexylene, or octylene group; each group $R^5$ is a 2-(3,4-epoxycyclohexyl)ethyl grouping, and each group $R^6$ is a hydrogen or ethenyl (—CH=CH$_2$).

Another example of a polyfunctional monomer represented by Structural Formula (III) is a monomer represented by Structural Formula (IX):

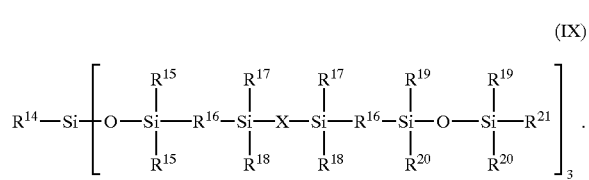

(IX)

$R^{14}$ is represented by Structural Formula (X) or (XI):

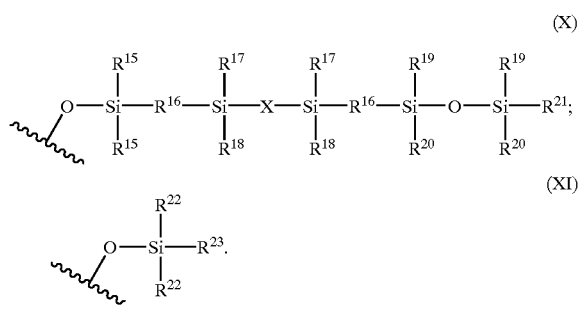

(X)

(XI)

Each group $R^{15}$, each group $R^{17}$, each group $R^{18}$, each group $R^{19}$, each group $R^{20}$ and each group $R^{22}$ is independently a substituted or unsubstituted $C_{1-12}$ alkyl, $C_{1-12}$ cycloalkyl, aryl substituted $C_{1-12}$ alkyl or aryl group.

$R^{16}$ is independently a substituted or unsubstituted $C_{1-12}$ alkylene, $C_{1-12}$ cycloalkylene, $C_{1-12}$ arylalkylene, or arylene group, —Y$_1$—[O—Y$_1$]$_p$—, —Y$_1$—Si(R$^z$)$_2$—Y$_1$—, —Y$_1$—Si(R$^z$)$_2$—Y$_1$—O—Y$_1$—Si(R$^z$)$_2$—Y$_1$—, or —Y$_1$—Si(R$^z$)$_2$—Y$_1$—Si(R$^z$)$_2$—Y$_1$—.

Each $R^{21}$ is independently an epoxide substituted aliphatic group having 2–10 carbon atoms.

$R^{23}$ is independently hydrogen, an alkenyl, a substituted or unsubstituted $C_{1-12}$ alkyl, $C_{1-12}$ cycloalkyl, aryl substituted $C_{1-12}$-alkyl or aryl or R$^z$—(O—Y$_1$)$_m$—, (R$^z$)$_3$Si—(O—Si(R$^z$)$_2$)$_q$—Y$_1$— or (R$^z$)$_3$Si—(O—Si(R$^z$)$_2$)$_q$—O—.

Each group X is independently oxygen or $R^{16}$.

$R^z$, Y$_1$, m, p and q are as described above.

Preferably, $R^{16}$ is independently a substituted or unsubstituted $C_{1-12}$ alkylene, $C_{1-12}$ cycloalkylene, $C_{1-12}$ arylalkylene, or arylene group; X is —O—; and each group $R^{23}$ is independently a hydrogen, a monovalent substituted or unsubstituted $C_{1-12}$ alkyl, $C_{1-12}$ dialkylether (alkyl-O-alkylene-), $C_{1-12}$ cycloalkyl $C_{1-12}$ alkylether (cycloalkyl-O-alkylene-), $C_{1-12}$ cycloalkyl, aryl substituted $C_{1-12}$ alkyl or aryl group.

Examples of specific monomers represented by Structural Formula (IX) are those in which X is —O—; $R^{14}$ is represented by Structural Formulas (X) and (XI); each group $R^{15}$, $R^{17}$, $R^{18}$ $R^{19}$, $R^{20}$ and $R^{22}$ is a methyl group; each group $R^{16}$ is an ethylene, hexylene, or octylene group; each group $R^{21}$ is a 2-(3,4-epoxycyclohexyl)ethyl grouping; and $R^{23}$ is a hydrogen, hexyl, or alkylether.

In a second preferred embodiment, the polyfunctional monomer is represented by Structural Formula (XII):

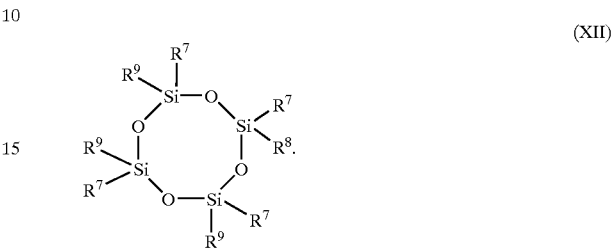

(XII)

Each group $R^7$ is independently an unsubstituted aliphatic group, a substituted aliphatic group, an unsubstituted aryl group or a substituted aryl group.

Each group $R^8$ is $R^9$, hydrogen, an alkenyl, a substituted or unsubstituted $C_{1-12}$ alkyl, $C_{1-12}$ cycloalkyl, aryl substituted $C_{1-12}$-alkyl or aryl or R$^z$—(O—Y$_1$)$_m$—, (R$^z$)$_3$Si—(O—Si(R$^z$)$_2$)$_q$—Y$_1$— or (R$^z$)$_3$Si—(O—Si(R$^z$)$_2$)$_q$—O—.

Each $R^9$ is independently represented by Structural Formula (II).

R$^z$, Y$_1$, q and m are as defined above.

In one example of a compound represented by Structural Formula (XII), $R^7$–$R^{13}$ are defined below.

Each group $R^7$ is independently a substituted or unsubstituted $C_{1-12}$ alkyl, $C_{1-12}$ cycloalkyl, aryl substituted $C_{1-12}$ alkyl or aryl group.

$R^8$ is a defined above. Preferably, $R^8$ is $R^9$ or a substituted or unsubstituted $C_{1-12}$ alkylsilane, $C_{1-12}$ cycloalkylsilane, $C_{1-12}$ alkoxysilane, arylsubstituted $C_{1-12}$ alkyl silane or a substituted or unsubstituted 1-alkenyl group or a substituted or unsubstituted $C_{1-12}$ n-alkenyl group where n is greater than or equal to 1.

$R^9$ is represented by Structural Formula (XIII):

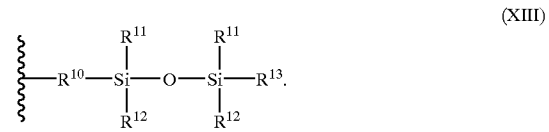

(XIII)

Each group $R^{10}$ is independently a substituted or unsubstituted $C_{1-12}$ alkylene, $C_{1-12}$ cycloalkylene, $C_{1-12}$ arylalkylene, or arylene group, —Y$_1$—[O—Y$_1$]$_p$—, —Y$_1$—Si(R$^z$)$_2$—Y$_1$—, —Y$_1$—Si(R$^z$)$_2$—Y$_1$—O—Y$_1$—Si(R$^z$)$_2$—Y$_1$—, or —Y$_1$—Si(R$^z$)$_2$—Y$_1$—Si(R$^z$)$_2$Y$_1$—. Preferably, each group $R^{10}$ is independently a substituted or unsubstituted $C_{1-12}$ alkylene, $C_{1-12}$ cycloalkylene, $C_{1-12}$ arylalkylene, or arylene group.

Each R$^z$, Y$_1$ and p is as defined above.

Each group $R^{11}$ and $R^{12}$ is independently a substituted or unsubstituted $C_{1-12}$ alkyl, $C_{1-12}$ cycloalkyl, aryl substituted $C_{1-12}$ alkyl group or aryl group.

Each group $R^{13}$ is independently an epoxide substituted aliphatic group having from 2–10 carbon atoms.

Specific examples of monomers represented by Structural Formula (XII) include those in which each $R^7$, each $R^{11}$ and each $R^{12}$ is a methyl group; $R^8$ is ethenyl (—CH=CH$_2$) or a $R^9$; $R^9$ is represented by Structural Formula (XIII); each group $R^{10}$ is an —$(CH_2)_2$—, —$(CH_2)_6$— or —$(CH_2)_8$—; and each group $R^{13}$ is a 2-(3,4-epoxycyclohexyl)ethyl group.

One example of a difunctional epoxide monomer suitable for use in the disclosed holographic recording materials is a compound represented by Structural Formula (XIV):

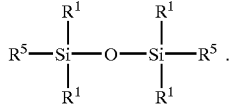

(XIV)

$R^1$ and $R^5$ are as defined above. Compounds of this type are commercially available from Polyset Corporation, Inc., Mechanicsville, N.Y.

Examples of suitable monofunctional epoxide monomers are represented by Structural Formula (XIVa):

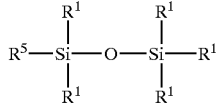

(XIVa)

An "inert linking group" is a moiety which: 1) does not react under conditions which induce or initiate cationic polymerization of epoxides; does not interfere with acid initiated cationic polymerization of epoxides; 3) and does not interfere with chemical segregation of binder from polymer formed during cationic polymerization of epoxides. An alkylene group (substituted or unsubstituted), i.e., —$(CH_2)_n$—, wherein n is a positive integer, preferably from 1–12, an arylene group (substituted or unsubstituted) and —O— are examples of an inert linking group. The term "arylene" refers to an aryl group which is connected to the remainder of the molecule by two other bonds. By way of example, the structure of a 1,4-phenylene group is shown below:

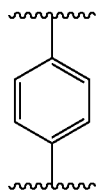

Others examples of suitable inert linking groups include (substituted or unsubstituted) an alkylene group (preferably $C_{1-12}$) in which one or more methylene groups are replaced with a cycloalkyl group (a "cycloalkylene group"), an aryl group (an "arylalkylene group"), —O— or —$Si(R^y)_2$—, wherein —$R^y$ is as defined above. Specific examples include —$Y_1$—$[O—Y_1]_p$—, —$Y_1$—$Si(R^z)_2$—$Y_1$—, —$Y_1$—$Si(R^z)_2$—$Y_1$—$O$—$Y_1$—$Si(R^z)_2$—$Y_1$—, or —$Y_1$—$Si(R^z)_2$—$Y_1$—$Si(R^z)_2$—$Y_1$—; and $Y_1$, $R^z$ and p are as defined above.

An "alkylsilane group" can be represented by $(R^z)_3Si$—$Y_1$—, wherein $R^z$ and $Y_1$ are as defined above, provided that at least one $R^z$ is alkyl; a "cycloalkylsilane group" can be represented by $(R^z)_3Si$—$Y_1$—, wherein $R^z$ and $Y_1$ are as defined above, provided that at least one $R^z$ is cycloalkyl; an "alkoxysilane group" can be represented by $(R^z-O-)_3Si$—$Y_1$—, wherein $R^z$ and $Y_1$ are as defined above, provided that at least one $R^z$ is alkyl; and an "aryl substituted alkylsilane group" can be represented by $(R^z)_3Si$—$Y_1$—, wherein $R^z$ and $Y_1$ are as defined above, provided that at least one $R^z$ is an aryl substituted alkyl group.

A "siloxane group" can be represented by $(R^z)_3SiO$—, wherein $R^z$ is as defined above. When at least one alkyl or aryl group represented by $R^z$ is substituted, the siloxane group is said to be substituted. A "polysiloxane group" can be represented by $(R^z)_3Si$—$(O$—$Si(R^z)_2)_q$—$O$—, wherein $R^z$ is as defined above and q is an integer, preferably from 1 to 4. When at least one alkyl or aryl group represented by $R^z$ is substituted, the polysiloxane group is said to be substituted.

A "dialkyl ether" can be represented by R—O—$Y_1$—, wherein R is an alkyl group and $Y_1$ is an alkylene group; and a "cycloalkylalkyl ether" can be represented by R—O—$Y_1$—, wherein R is a cycloalkyl group and $Y_1$ is an alkylene group.

An aliphatic group is a straight chained, branched or cyclic non-aromatic hydrocarbon which is completely saturated or which contains one or more units of unsaturation. Typically, a straight chained or branched aliphatic group has from 1 to about 12 carbon atoms, preferably from 1 to about 8, and a cyclic aliphatic group has from 3 to about 10 carbon atoms, preferably from 3 to about 8. An aliphatic group is preferably a straight chained or branched alkyl group, e.g., methyl, ethyl, n-propyl, iso-propyl, n-butyl, sec-butyl, tert-butyl, pentyl, hexyl, heptyl or octyl, or a cycloalkyl group with 3 to about 8 carbon atoms. A $C_{1-12}$ straight chained or branched alkyl group or a $C_{3-8}$ cyclic alkyl group is also referred to as a "lower alkyl" group. An aliphatic group with one unit of unsaturation is referred to an "alkenyl" group.

Suitable aryl groups groups for momomers of the present invention are those which 1) do not react under conditions which induce or initiate cationic polymerization of epoxides; 2) do not interfere with acid initiated cationic polymerization of epoxides; 3) and do not interfere with chemical segregation of binder from polymer formed during cationic polymerization of epoxides. Examples include, but are not limited to, carbocyclic aromatic groups such as phenyl, naphthyl and biphenyl.

Suitable substituents on an aliphatic group (including an alkylene or alkenyl group) or an aryl group carbocyclic and heteroaryl) are those which 1) do not react under conditions which induce or initiate cationic polymerization of epoxides; 2) do not interfere with acid initiated cationic polymerization of epoxides; 3) and do not interfere with separation of binder from polymer formed during cationic polymerization of epoxides unless the group comprises an epoxide moiety. Examples of suitable substituents include, but are not limited to, halogens, $R_3Si$—, alkyl groups, aryl groups and —OR. Each R is independently a substituted or unsubstituted aliphatic group or a substituted or unsubstituted aryl group, preferably an alkyl group or an aryl group.

The binder used in the process and preparation of the present medium should, of course, be chosen such that it does not inhibit cationic polymerization of the monomers used (e.g., "supports" cationic polymerization), such that it is miscible with the monomers used and the polymerized structure obtained from such monomers, and such that its refractive index is significantly different from that of the polymerized monomer or oligomer (e.g., the refractive index of the binder differs from the refractive index of the polymerized monomer by at least 0.04 and preferably at least 0.09). Binders can be inert to the polymerization processes described herein or optionally can polymerize during one or more of the polymerization events.

Preferred binders for use in the current process are polysiloxanes, due in part to availability of a wide variety of polysiloxanes and the well documented properties of these oligomers and polymers. The physical, optical, and chemical properties of the polysiloxane binder can all be adjusted for optimum performance in the recording medium inclusive of, for example, dynamic range, recording sensitivity, image fidelity, level of light scattering, and data lifetime. The efficiency of the holograms produced by the present process in the present medium is markedly dependent upon the particular binder employed. Although those skilled in the holographic art will have no difficulty in selecting an appropriate binder by routine empirical tests, in general it may be stated that poly(methyl phenyl siloxanes) and oligomers thereof, such as 1,3,5-trimethyl-1,1,3,5,5-pentaphenyltrisiloxane. Examples are sold by Dow Corning Corporation under the tradename DOW Corning 705 (a trimer) and DOW Corning 710 and have been found to give efficient holograms.

The acid generator used in the recording medium of the present invention produces an acid upon exposure to the actinic radiation. The term "acid generator" or PAG is used herein to refer to the component or components of the medium that are responsible for the radiation-induced formation of acid. Thus, the acid generator may comprise only a single compound that produces acid directly. Alternatively, the acid generator may comprise an acid generating component which generates acid and one or more sensitizers which render the acid generating component sensitive to a particular wavelength of actinic radiation, as discussed in more detail below. The acid produced from the acid generator may be either a Bronstead acid or Lewis acid, provided of course that the acid is of a type and strength which will induce cationic polymerization of the monomer. When the acid produces a Bronstead acid, this acid preferably has a $pK_a$ less than about 0. Known superacid precursors such as diazonium, sulfonium, phosphonium and iodonium salts may be used in the present medium, but iodonium salts are generally preferred. Diaryliodonium salts have been found to perform well in the present media, with specific preferred diaryliodonium salts being (5-octyloxyphenyl)phenyliodonium hexafluoroantimonate and ditolyliodonium tetrakis(pentafluorophenyl)borate, diphenyliodonium tetrakis(pentafluorophenyl)borate, tolylphenyliodonium tetrakis(pentafluorophenyl)borate and cumyltolyliodonium tetrakis(pentafluorophenyl)borate.

In the absence of any sensitizer, iodonium salts are typically only sensitive to radiation in the far ultra-violet region, below about 300 nm, and the use of far ultra-violet radiation is inconvenient for the production of holograms because for a given level of performance ultra-violet lasers are substantially more expensive than visible lasers. It is well known, however, that by the addition of various sensitizers, iodonium salts can be made sensitive to various wavelengths of actinic radiation to which the salts are not substantially sensitive in the absence of the sensitizer. Such sensitizers include, by way of example, Rubrene. In addition, iodonium salts can be sensitized to visible radiation using certain aromatic hydrocarbons substituted with at least two alkynyl groups or two alkenyl groups, a specific preferred sensitizer of this type being 5,12-bis(phenylethynyl)naphthacene. This sensitizer renders iodonium salts sensitive to the 514.5 nm radiation from an argon ion laser, and to the 532 nm radiation from a frequency-doubled YAG laser, both of which are convenient sources for the production of holograms. Preferably, the sensitizer is photobleachable so that the visible absorption of the holographic medium decreases during exposure.

The proportions of acid generator, sensitizer, binder and monomers in the holographic recording medium of the present invention may vary rather widely, and the optimum proportions for specific components and methods of use can readily be determined empirically by skilled workers. Guidance in selecting suitable proportions is provided in U.S. Pat. No. 5,759,721, the teachings of which are incorporated herein by reference. In general, however, it is preferred that the present medium comprise from about 0.25 to about 5 parts by weight of the monofunctional or difunctional epoxide per part by weight of the polyfunctional epoxide monomer which has an epoxy equivalent weight greater than about 300 (g/mole epoxide). The solution of monomers with binder can comprise a wide range of compositional ratios, preferably ranging from about 90 parts binder and 10 parts monomer or oligomer (w/w) to about 10 parts binder and 90 parts monomer or oligomer (w/w). It is preferred that the medium comprise from about 0.167 to about 5 parts by weight of the binder per total weight of the monomers.

Typically, the medium comprises between about 0.005% and about 0.5% by weight sensitizer, when present, and between about 1.0% and about 10.0% by weight acid generator.

Syntheses of the polyfunctional monomers of the present invention are shown in Schemes 1–5. These syntheses are based on a hydrosilylation in which an olefin is reacted with a silane in the presence of a suitable metal catalyst, such as the Karstedt catalyst (see U.S. Pat. No. 3,715,334), tetrakis(triphenylphosphine)platinum(0), or Wilkinson's catalyst ($RhCl(Ph_3P)_3$). In particular, the syntheses selectively react a single silane group (—Si—H) in a compound comprising two more such groups. Selective hydrosilyation reactions of this type are described, for example, in U.S. Pat. No. 5,484,950, Crivello et al., *Polymer Preprints* 32:173 (1991), Crivello et al., *J. Macromolecular Science—Pure and Applied Chemistry* A31:1001 (1994) and Crivello and Bi, *Polymer Science* 32:683 (1994), the entire teachings of which are incorporated herein by reference.

In Scheme 1, one silane group of tetramethyldisiloxane (XV) is reacted with an epoxide substituted aliphatic olefin such as the compound represented by structural formula (XVI). The product, represented by Structural Formula (XVII), can then undergo a second hydrosilylation reaction with tetrakis(vinyldimethylsiloxy)silane, represented by Structural Formula (XVIII), to form the product represented by Structural Formula (XIX). It is noted that this product is encompassed within Structural Formula (VI). Specific conditions for carrying out these reactions are provided in Example 1.

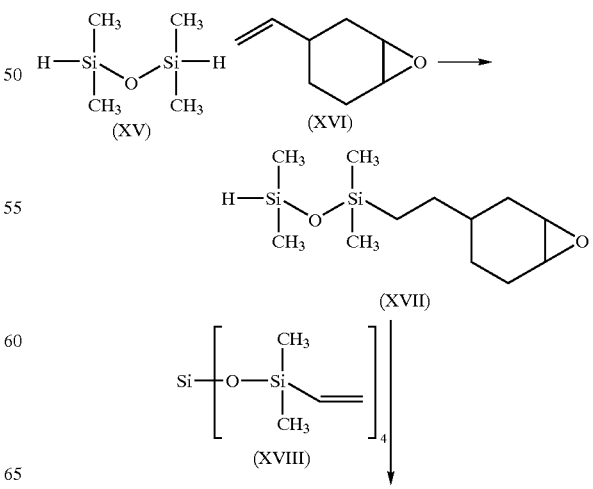

Scheme 1

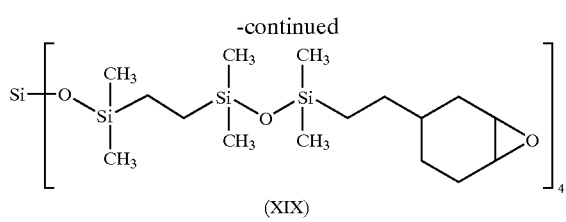

(XIX)

Polyfunctional epoxide monomers with longer chains can be prepared according to Scheme 2, which utilizes an additional hydrosilylation reaction. Specifically, compound (XVII) is hydrosilylated with a diolefin, preferably with an excess of the diolefin. The product, represented by Structural Formula (XX), then undergoes a second hydrosilylation with tetrakis(dimethylsiloxy)silane, represented by Structural Formula (XXI). The final product, represented by Structural Formula (XXII), is encompassed within Structural Formula (III). $R^2$ in Scheme 2 is $-(CH_2)_{n+4}-$. Specific conditions for these reactions are provided in Example 2.

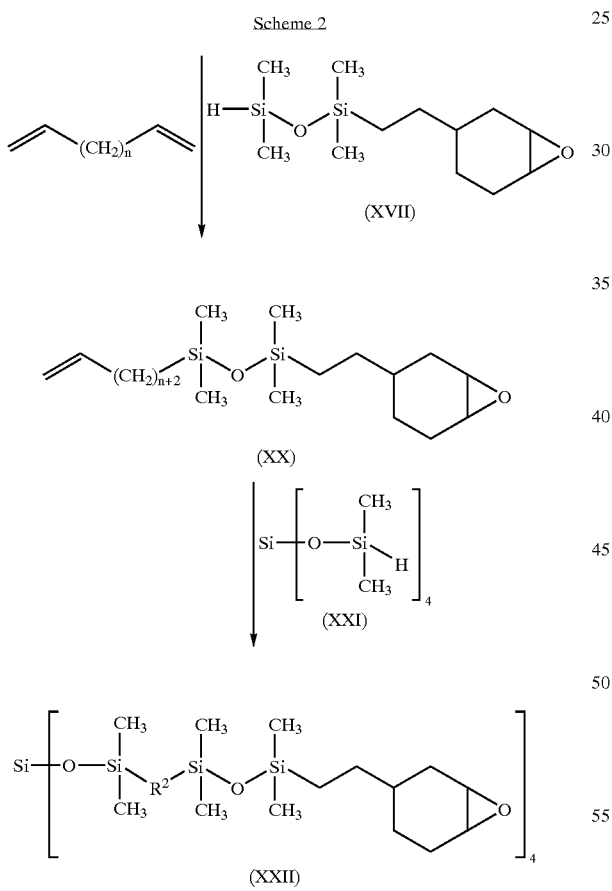

Scheme 2

Further chain elongations are possible, as shown in Scheme 3. The intermediate represented by Structural Formula (XX) is hydrosilylated with 1,1,3,3-tetramethyldisiloxane (XXIII) to form a product represented by Structural Formula (XXIV), which is then used to hydrosilylate tetrakis(vinyldimethylsiloxy)silane to form a product represented by Structural Formula (XXV). This final product is encompassed within Structural Formula (IX). $R^{16}$ in Scheme 3 is $-(CH_2)_{n+4}-$; and $R^{16A}$ is $-(CH_2)_2-$.

Scheme 3

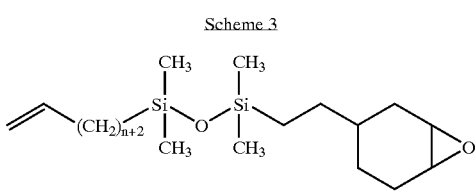

(XX)

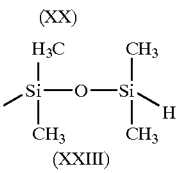

(XXIII)

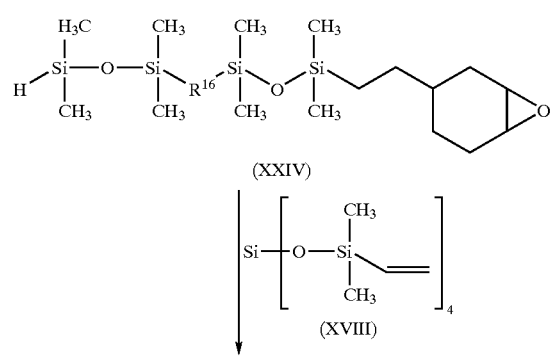

(XXIV)

(XVIII)

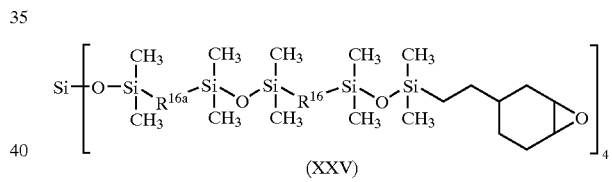

(XXV)

In Scheme 4, 1-[2-(3{7-oxabicyclo[4.1.0]heptyl})ethyl]-tetramethyldisiloxane (XVII) is reacted with 2,4,6,8-Tetramethyl-2,4,6,8-tetravinylcyclotetrasiloxane (XXVI) to form the product XXVII, which is encompassed within Structural Formula (XII). Specific conditions for this reaction are provided in Example 3.

Scheme 4

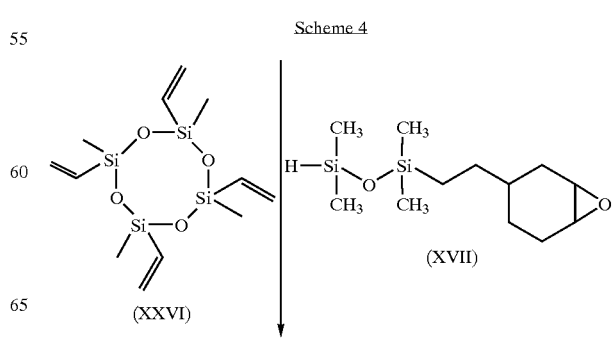

(XXVI)   (XVII)

15

-continued

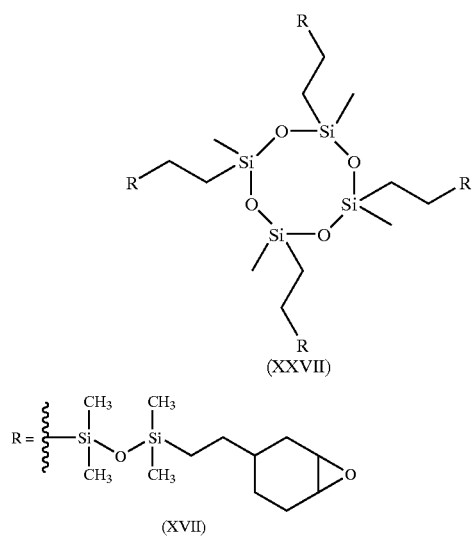

(XXVII)

(XVII)

Scheme 5 shows the same synthesis as Scheme 3, except that 1,3-divinyltetramethyldisiloxane is used in place of an aliphatic diene. The product represented by Structural Formula (XXX), is encompassed within Structural Formula (IX). Specific conditions for carrying out this transformation is provided in Examples 4–5.

Scheme 5

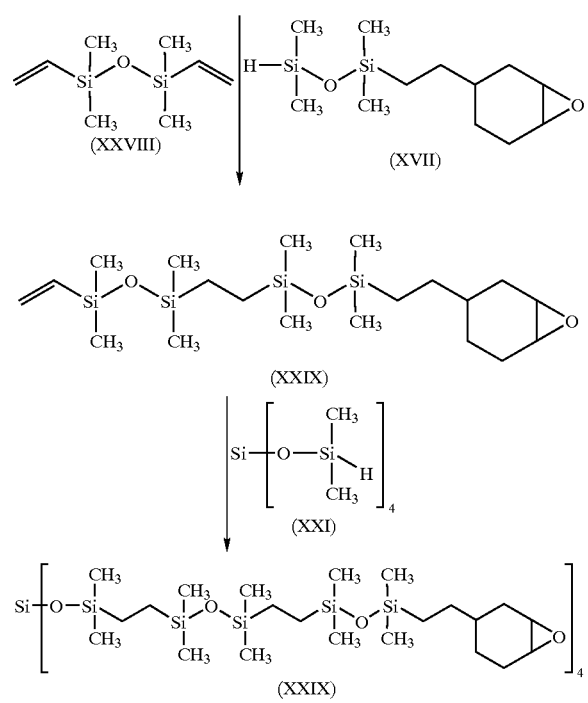

The following examples are now given, though by way of illustration only, to show details of particularly preferred reagents, conditions, and techniques used in referred media and processes of the present invention.

16

EXEMPLIFICATION

Example 1

Preparation of a Compound Represented by Structural Formula (XIX)

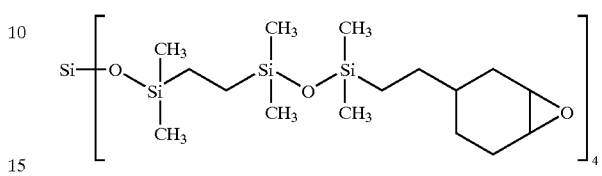

Tetrakis(vinyldimethylsiloxy)silane (Gelest Inc., SIT7312.0) (81.34 g, 188 mmol) and toluene (25 ml) were charged to an oven dried pressure equalized addition funnel. 1-[2-(3{7-oxabicyclo[4.1.0]heptyl})ethyl]-tetramethyldisiloxane (194.30 g, 752 mmol) was added into an oven dried 1 liter three-necked flask equipped with a magnetic stirrer, pressure equalized addition funnel, thermometer, and an air condenser with a top mounted inlet/outlet for supply of inert gas. Toluene (50.0 ml) was added to the reaction vessel. The mixture was stirred under inert gas atmosphere and then tetrakis(triphenylphosphine) platinum(0) (1.50 mg dissolved in 1.50 ml toluene) was added via a gas tight syringe at ambient temperature. Internal temperature was raised to 55° C. and tetrakis (vinyldimethylsiloxy)silane was added dropwise to the reaction vessel at 55° C. Addition was complete within 4 hours and 20 minutes. The contents were stirred for an additional 4 hours and an aliquot was taken and analyzed by Thin Layer Chromatography (TLC). TLC analysis revealed that the reaction for formation of tetramer was proceeding, but at a slow rate.

Tetrakis(triphenylphosphine)platinum(0) (0.5 mg) and 1-[2-(3{7-oxabicyclo[4.1.0]heptyl})ethyl]-tetramethyldisiloxane (1.02 g, 3.0 mmol) was added additionally and the internal temperature was raised to 65° C. The contents were stirred at this temperature for 17 hours, and Infrared Spectroscopy (FTIR) analysis of the Si—H stretching region revealed no remaining Si—H. The reaction content was cooled to ambient temperature and it was further diluted with 500 ml hexanes and treated with charcoal. Charcoal was removed by filtration and volatiles were removed by rotatory evaporator. Tetrafunctional epoxy monomer was then stirred under high vacuum (50–75 millitorr) overnight to remove remaining residual volatiles, and then filtered under nitrogen using a 1.0 micron syringe filter. Yield was 272 g, 98.7%.

The resulting tetrafunctional epoxy monomer was mixed with an iodonium salt photoacid generator (cumyltolyliodonium tetrakis(pentafluorophenyl)borate) (5 wt %) and the uniform mixture was tested by Photo-Differential Scanning Calorimetry (PDSC) for photochemical sensitivity. Development of exothermicity, obtained by PDSC, was extremely rapid after the onset of exposure to broad band Hg radiation at an irradiance level of 8.5 mW/cm². The peak position occurred at 0.119 minutes and the onset of exothermicity was at 0.052 minutes. The cal culated enthalpy of polymerization reaction was 77.32 kJ/(mole epoxide equivalent). The procedure followed for this measurement has been described by Waldman et al. *J. Imaging Sci. Technol.* 41(5): 497–514 (1997).

Example 2

Preparation of the Compound Represented by Structural Formula (XXII)

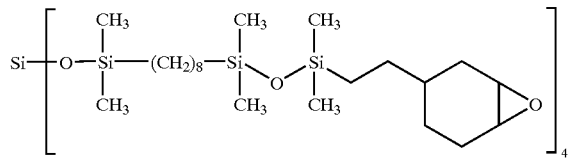

Tetrakis(dimethylsiloxy)silane (4.6019 g, 0.014 mol) and toluene (12.0 ml) were charged into an oven-dried 250-ml three-necked flask which was equipped with a magnetic stirrer, pressure equalized addition funnel, thermometer, and a condenser topped by an argon inlet/outlet. The reaction mixture was kept at ambient temperature and Karstedt catalyst (1.0 mg of Gelest Inc., SIP6831.1 soln.) in 1.0 ml toluene was added. 1,1,3,3-Tetramethyl-1-oct-7-enyl-3-[2-(7-oxa-bicyclo[4.1.0]hept-3-yl)-ethyl]-disiloxane (20.65 g, 0.056 mol) synthesized according to literature methods (Crivello, et al., *Polym. Prepr.* (*Am. Chem. Soc., Div. Polym. Chem.*) 32(3):173–4 (1991), and Crivello, et al., *J Polym. Sci., Part A: Polym. Chem.* 31(10):2563–2572 (1993), was charged into the addition funnel. Addition of 1,1,3,3-tetramethyl-1-oct-7-enyl-3-[2-(7-oxa-bicyclo [4.1.0]hept-3-yl)-ethyl]-disiloxane was carried out between 32–36° C. and was completed within one hour. Reaction progress was monitored using FTIR analysis of the Si—H stretching mode until no changes in Si—H content were observed. Additional catalyst solution (1.5 mg) and 1,1,3,3-Tetramethyl-1-oct-7-enyl-3-[2-(7-oxa-bicyclo[4.1.0]hept-3-yl)-ethyl]-disiloxane (0.5 g) were added and contents were stirred at 40° C. until FTIR analysis revealed that Si—H content was no longer discernable. The reaction mixture was diluted with 100 ml hexanes and treated with charcoal. Charcoal was removed via filtration and volatiles were removed by rotatory evaporator. The resulting product was kept under high vacuum for 17 hours to remove residual volatiles. The tetrafunctional epoxy monomer was filtered through a 1.0 μm syringe filter under nitrogen environment. Yield was 24.86 g, or 98%.

Photo-Differential Scanning Calorimetry (PDSC) was performed as described in Example 1. Development of exothermicity was extremely rapid after the onset of exposure to broad band Hg radiation at an irradiance level of 8.5 mW/cm². The peak position occurred at 0.139 minutes and the onset of exothermicity was at 0.062 minutes. The epoxy equivalent weight of the tetrafunctional epoxy monomer was 450.9. The enthalpy value was 79.92 kJ/mol epoxy equivalent.

Example 3

Synthesis of the Compound Represented by Structural Formula (XXVII) (1378.7/344.7 g/mole epoxide)

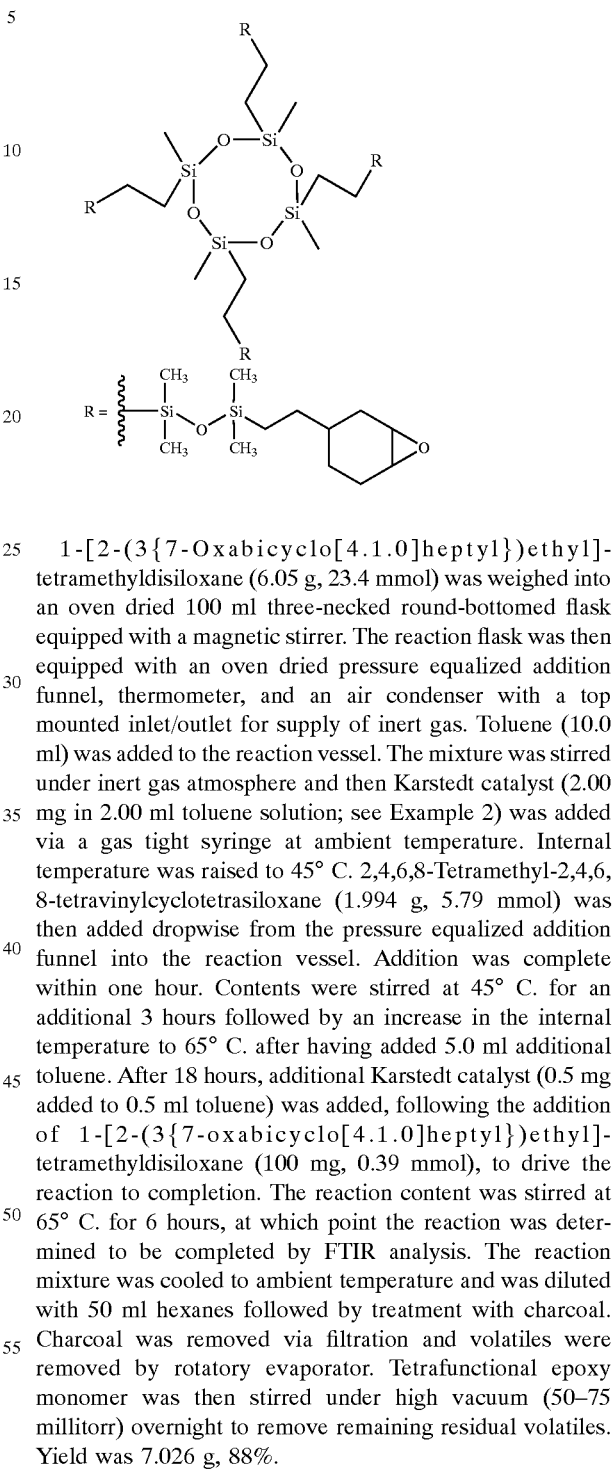

1-[2-(3{7-Oxabicyclo[4.1.0]heptyl})ethyl]-tetramethyldisiloxane (6.05 g, 23.4 mmol) was weighed into an oven dried 100 ml three-necked round-bottomed flask equipped with a magnetic stirrer. The reaction flask was then equipped with an oven dried pressure equalized addition funnel, thermometer, and an air condenser with a top mounted inlet/outlet for supply of inert gas. Toluene (10.0 ml) was added to the reaction vessel. The mixture was stirred under inert gas atmosphere and then Karstedt catalyst (2.00 mg in 2.00 ml toluene solution; see Example 2) was added via a gas tight syringe at ambient temperature. Internal temperature was raised to 45° C. 2,4,6,8-Tetramethyl-2,4,6,8-tetravinylcyclotetrasiloxane (1.994 g, 5.79 mmol) was then added dropwise from the pressure equalized addition funnel into the reaction vessel. Addition was complete within one hour. Contents were stirred at 45° C. for an additional 3 hours followed by an increase in the internal temperature to 65° C. after having added 5.0 ml additional toluene. After 18 hours, additional Karstedt catalyst (0.5 mg added to 0.5 ml toluene) was added, following the addition of 1-[2-(3{7-oxabicyclo[4.1.0]heptyl})ethyl]-tetramethyldisiloxane (100 mg, 0.39 mmol), to drive the reaction to completion. The reaction content was stirred at 65° C. for 6 hours, at which point the reaction was determined to be completed by FTIR analysis. The reaction mixture was cooled to ambient temperature and was diluted with 50 ml hexanes followed by treatment with charcoal. Charcoal was removed via filtration and volatiles were removed by rotatory evaporator. Tetrafunctional epoxy monomer was then stirred under high vacuum (50–75 millitorr) overnight to remove remaining residual volatiles. Yield was 7.026 g, 88%.

Photo-Differential Scanning Calorimetry (PDSC) was performed as described in Example 1. Development of exothermicity was rapid after the onset of exposure to broad band Hg radiation. The peak position was at 0.126 minutes and the onset of exothermicity was at 0.059 minutes. The calculated enthalpy of polymerization reaction was 59.80 kJ/(mole epoxide equivalent).

Example 4
Synthesis of 3-(2-{1,1,3,3-Tetramethyl-3-[2-(1,1,3,3-tetramethyl-3-vinyl-disiloxanyl)-ethyl ]-disiloxanyl}-ethyl)-7-oxa-bicyclo[4.1.0]heptane.

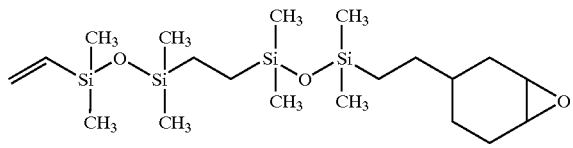

1,3-Divinyltetramethyldisiloxane (20.00 g, 107.3 mmol) was weighed into an oven dried 100 ml three-necked round-bottomed flask equipped with a magnetic stirrer. The reaction flask was then equipped with an oven dried pressure equalized addition funnel, thermometer, and an air condenser with a top mounted inlet/outlet for supply of inert gas. Tetrakis(triphenylphosphine)platinum(0) (1.00 mg dissolved in 1.00 ml toluene) was added via a gas tight syringe at ambient temperature. 1-[2-(3{7-Oxabicyclo[4.1.0]heptyl})ethyl]-tetramethyldisiloxane (13.87 g 53.6 mmol) was charged into the addition funnel and added dropwise into the reaction vessel maintaining the internal temperature at 30–35° C. Addition was complete within 45 minutes. Contents were stirred at 40° C. for 6 hours after completing the addition. The progress of the reaction was monitored by gas chromatography (GC). GC analysis of an aliquot revealed that the reaction was progressing slowly after 6 hours at 40° C. The internal temperature was increased to 45° C. and the continued presence of 1-[2-(3{7-oxabicyclo[4.1.0]heptyl})ethyl]-tetramethyldisiloxane was observed. Additional catalyst (0.25 mg) was added and the internal temperature was increased further to 55° C. The reaction mixture was stirred at 55° C. for 24 hours. The remaining amount of 1-[2-(3{7-oxabicyclo[4.1.0]heptyl})ethyl]-tetramethyldisiloxane, as determined by GC analysis, had diminished to about 2% of it original quantity. Further addition of catalyst (0.25 mg) did not improve the reaction conversion. The reaction mixture was diluted with 50 ml hexanes at ambient temperature and treated with charcoal. Charcoal was removed by filtration, and volatiles were removed by rotatory evaporator. Monofunctional epoxy monomer was then stirred under high vacuum (50–75 millitorr) for 6 hours to remove remaining residual volatiles and the product was further purified by vacuum distillation. The final product was collected in the temperature range of 145–150° C. (50 millitorr). The product, 3-(2-{1,1,3,3-tetramethyl-3-[2-(1,1,3,3-tetramethyl-3-vinyl-disiloxanyl)-ethyl]-disiloxanyl}-ethyl)-7-oxa-bicyclo[4.1.0]heptane, was free from 1-[2-(3{7-oxabicyclo[4.1.0]heptyl})ethyl]-tetramethyldisiloxane. Yield was 18.09 g, 76%.

Example 5
Synthesis of the Compound Represented by Structural Formula (XXX)

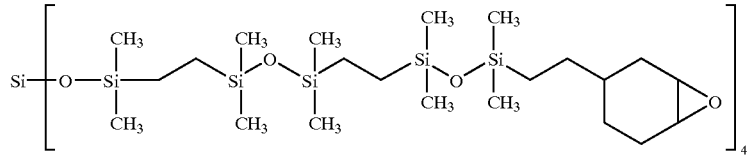

Tetrakis(dimethylsiloxy)silane (1.66 g, 5.0 mmol) and toluene (12 ml) were charged into an oven dried 100 ml three-necked round-bottom flask equipped with a magnetic stirrer, a pressure equalized addition funnel, thermometer, and an air condenser with a top mounted inlet/outlet for supply of inert gas. The mixture was stirred under inert gas atmosphere and then tetrakis(triphenylphosphine)platinum (0) (1.00 mg dissolved in 1.00 ml toluene) was added via a gas tight syringe at ambient temperature. Internal temperature was raised to 45° C. 3-(2-{1,1,3,3-Tetramethyl-3-[2-(1,1,3,3-tetramethyl-3-vinyl-disiloxanyl)-ethyl]-disiloxanyl}-ethyl)-7-oxa-bicyclo[4.1.0]heptane (9.07 g, 20.4 mmol) and toluene (8 ml) were charged to the pressure equalized addition funnel and then added dropwise into the reaction vessel. Addition was complete within one hour and the reaction mixture was stirred for an additional 6 hours. Infrared Spectroscopy (FTIR) analysis revealed remaining Si—H. Additional catalyst (0.25 mg) and monovinyl precursor (0.35 g, 0.79 mmol) were added into the reaction flask at 45° C. The internal temperature was raised to 65° C. The contents were stirred at this temperature for 18 hours. Infrared Spectroscopy (FTIR) analysis revealed no remaining Si—H. The reaction mixture was cooled to ambient temperature and it was further diluted with 100 ml hexanes and treated with charcoal. Charcoal was removed by filtration and volatiles were removed by rotatory evaporator. Tetrafunctional epoxy monomer was then stirred under high vacuum (50–75 millitorr) for 6 hours to remove remaining residual volatiles, followed by filtration under nitrogen through a 1.0 μm syringe filter. Yield was 9.8 g, 91%.

Photo-Differential Scanning Calorimetry (PDSC) was performed as described in Example 1. Development of exothermicity was extremely rapid after the onset of exposure to broad band Hg radiation at an irradiance level of 8.5 mW/cm$^2$. The peak position was at 0.130 minutes and the onset of exothermicity was at 0.064 minutes. The calculated enthalpy of polymerization reaction was 87.59 kJ/(mole epoxide equivalent).

Example 6
Preparation of a Holographic Recording Medium with the Compound Prepared in Example 1

The polyfunctional monomer prepared in Example 1 was first added to a difunctional epoxide monomer represented by Structural Formula (XIV):

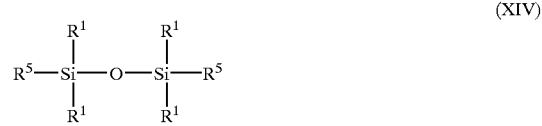

(XIV)

where each group $R^5$ is a 2-(3,4-epoxycyclohexyl)ethyl grouping; and each grouping $R^1$ is a methyl group, and which is available from Polyset Corporation, Inc., Mechanicsville, N.Y., under the tradename PC-1000. The mole ratio of polyfunctional monomer to difunctional monomer was 0.37:1.0. The mixture of monomers was then stirred to form a uniform and homogeneous mixture. To this mixture was then added DOW Coming 705 silicone fluid in a mole ratio of 0.519:1.0 binder to total monomer, and the contents was then stirred at room temperature to form a uniform mixture. To this mixture was added 6% by weight of the final recording medium of cumyltolyliodonium tetrakis(pentafluorophenyl)borate dissolved in methylene chloride, and the resulting mixture was stirred to form a uniform mixture. To this solution was added the sensitizer, 5,12-bis(phenylethynyl)naphthacene, dissolved in methylene chloride at 0.013% by weight of the final recording medium while stirring. Solvent was removed by bubbling with flowing argon and by application of vacuum.

Slant fringe, plane-wave, transmission holograms were recorded in the above media in the conventional manner with two spatially filtered and collimated argon ion laser writing beams at 514.5 nm with equal irradiance levels directed onto the sample with equal semiangles of about 25° about the normal. A beam expanded and collimated HeNe probe beam, incident at the appropriate Bragg angle, was used to detect the development of holographic activity during exposure. Real time diffraction intensity data was obtained using two Model 818-SL photodiodes and a dual channel multi-function optical meter Model 2835-C from Newport Corporation. Six hundred plane-wave transmission holograms were multiplexed sequentially and co-locationally using a scheduled exposure series combining angle and peristrophic multiplexing methods. The cumulative grating strength attained was measured from the sum of the square roots of the diffraction efficiencies for each individual hologram. The value exhibited by the medium with 200 micron thickness is about 16.5. This value represents about a 40% improvement in dynamic range as compared to results obtained for multiplexed recording carried out in a similar fashion for recording media described in U.S. Pat. No. 5,759,721 and in U.S. patent application Ser. No. 08-970,066. The final physical state of the fully exposed recording medium is more resistant to mechanical failure resulting from brittle mechanical properties associated with crosslinked microstructure. Photodifferential scanning calorimetry experiments, using $Ar^+$ laser radiation at the same intensity as used for holographic recording, was carried out to measure the extent of polymerization reaction (kJ/mole epoxide) attained. The extent of reaction achieved when the medium of the present invention was exposed to a level of saturation fluence was 74 kJ/mole epoxide, which substantially exceeded the value exhibited by media described in U.S. Pat. No. 5,759,721 and in U.S. patent application Ser. No. 08-970,066.

Example 7
Preparation of a Holographic Recording Medium with the Compound Prepared in Example 2

A polyfunctional monomer prepared in Example 2, with epoxy equivalent weight of 451 (grams/mole epoxide), was first added to a difunctional epoxide monomer of the Structural Formula (XIV) where each group $R^5$ is a 2-(3,4-epoxycyclohexyl)ethyl grouping; each grouping $R^1$ is a methyl group, and which is available from Polyset Corporation, Inc., Mechanicsville, New York, under the tradename PC-1000. The mole ratio of polyfunctional monomer to difunctional monomer was 0.30:1.0. The mixture of monomers was then stirred to form a uniform and homogeneous mixture. To this mixture was then added DOW Coming 705 silicone fluid in a mole ratio of 0.664:1.0 binder to total monomer, and the contents was then stirred at room temperature to form a uniform mixture. To this mixture was added 6% by weight of the final recording medium of cumyltolyliodonium tetrakis(pentafluorophenyl)borate dissolved in methylene chloride, and the resulting mixture was stirred to form a uniform mixture. To this solution was added the sensitizer, 5,12-bis(phenylethynyl)naphthacene, dissolved in methylene chloride at about 0.013% by weight of the final recording medium while stirring. Solvent was removed by bubbling with flowing argon and by application of moderate vacuum.

Slant fringe, plane-wave, transmission holograms were recorded in the above media in the conventional manner with two spatially filtered and collimated argon ion laser writing beams at 514.5 nm with equal irradiance levels directed onto the sample with equal semiangles of about 25° about the normal. A beam expanded and collimated HeNe probe beam, incident at the appropriate Bragg angle, was used to detect the development of holographic activity during exposure. Real time diffraction intensity data was obtained using two Model 818-SL photodiodes and a dual channel multi-function optical meter Model 2835-C from Newport Corporation. Six hundred plane-wave transmission holograms were multiplexed sequentially and co-locationally using a scheduled exposure series combining angle and peristrophic multiplexing methods. The cumulative grating strength attained was measured from the sum of the square roots of the diffraction efficiencies for each individual hologram. The value exhibited by the medium with 200 micron thickness is about 18. This value represents about a 50% improvement in dynamic range as compared to results obtained for multiplexed recording carried out in a similar fashion for recording media described in U.S. Pat. No. 5,759,721 and in U.S. patent application Ser. No. 08-970,066. Photodifferential scanning calorimetry experiments, using $Ar^+$ laser radiation at the same intensity as used for holographic recording, was carried out to measure the extent of polymerization reaction (kJ/mole epoxide) attained. The extent of reaction achieved when the medium of the present invention was exposed to a level of saturation fluence, was 78 KJ/mole epoxide, which substantially exceeded the value exhibited by media described in U.S. Pat. No. 5,759,721 and in U.S. patent application Ser. No. 08-970,066.

The shift in Bragg angle from the recording condition was measured for the entire set of multiplexed plane-wave holograms that were recorded sequentially and co-locationally in the medium of the present invention. When the multiplexed recording was preceded by various pre-imaging exposure conditions, then values for both the dynamic range and the angular shifts were reduced from those observed with no pre-imaging exposure. The magnitude of the shift in Bragg angle is directly related to the magnitude of transverse shrinkage or dimensional change in the thickness direction of the recording media, while the dynamic range is a measure of the materials storage capacity. Additionally, the measured angle shifts exhibited significantly diminished values relative to those shown by recording media described in U.S. Pat. No. 5,759,721 and in U.S. patent application Ser. No. 08-970,066, whereas the cumulative grating strength attained by the recording medium of this invention exceeded the value exhibited by recording media described in U.S. Pat. No. 5,759,721 and in U.S. patent application Ser. No. 08-970,066. Accordingly, the recording medium of the present invention exhibits both higher dynamic range and lower shrinkage than observed for recording media such as described in U.S. Pat. No. 5,759,721 and in U.S. patent application Ser. No. 08-970,066. The final physical state of the fully exposed recording medium is more resistant to mechanical failure resulting from brittle mechanical properties associated with crosslinked microstructure.

Example 8
Polyfunctional Monomers Suitable for Use in Holographic Recording Materials Shown below are the structures of other polyfunctional monomers prepared by the synthetic methods described herein and shown to be suitable according to methods in Examples 6 and 7 for use in holographic recording materials:

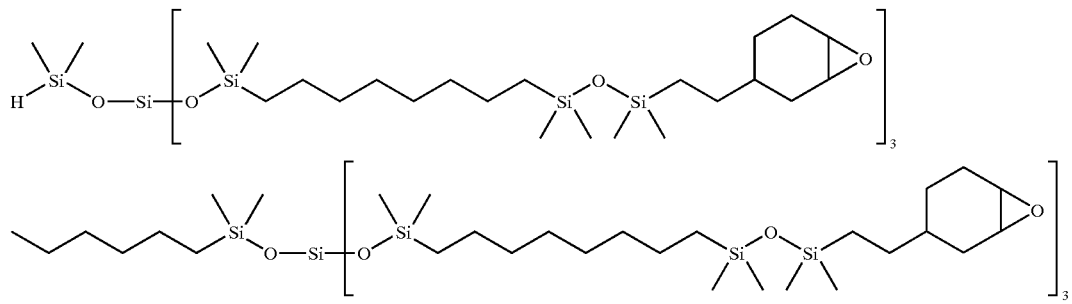

While this invention has been particularly shown and described with references to preferred embodiments thereof, it will be understood by those skilled in the art that various changes in form and details may be made therein without departing from the scope of the invention encompassed by the appended claims.

What is claimed is:

1. A compound is represented by the following structural formula:

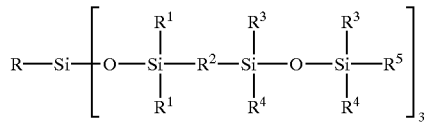

wherein R is represented by a structural formula selected from:

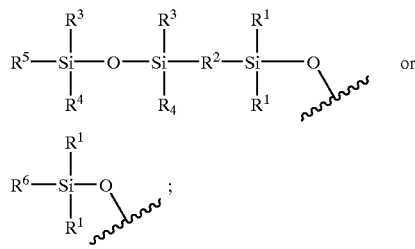

wherein:
  each group $R^1$, each group $R^3$ and each group $R^4$ is independently a substituted or unsubstituted $C_{1-12}$ alkyl, $C_{1-12}$ cycloalkyl, aryl substituted $C_{1-12}$ alkyl or aryl group;
  each group $R^2$ is independently a substituted or unsubstituted $C_{1-12}$ alkylene, $C_{1-12}$ cycloalkylene, $C_{1-12}$ arylalkylene, or arylene group, $-Y_1-[O-Y_1]_p-$, $-Y_1-Si(R^z)_2-Y_1-$, $-Y_1-Si(R^z)_2-Y_1-O-$ $Y_1-Si(R^z)_2-Y_1-$, or $-Y_1-Si(R^z)_2-Y_1-Si(R^z)_2-Y_1-$;
  each group $R^5$ is independently, an epoxide substituted aliphatic group having 2–10 carbon atoms; and
  each group $R^6$ is independently hydrogen, an alkenyl, a substituted or unsubstituted $C_{1-12}$ alkyl, $C_{1-12}$ cycloalkyl, aryl substituted $C_{1-12}$-alkyl or aryl or $R^z-(O-Y_1)_m-$, $(R^z)_3Si-(O-Si(R^z)_2)_q-Y_1-$ or $(R^z)_3Si-(O-Si(R^z)_2)_q-O-$;
  each $R^z$ is independently a substituted or unsubstituted $C_{1-12}$ alkyl group, $C_{1-12}$ cycloalkylalkyl group, aryl substituted $C_{1-12}$ alkyl group or aryl group;
  each $Y_1$ is independently a $C_{1-12}$ alkylene group;
  p is an integer from 1 to 5; m is an integer from 1 to 10; and q is an integer from 0 to 4.

2. The compound of claim 1 wherein each group $R^2$ is independently, a substituted or unsubstituted $C_{1-12}$ alkylene, $C_{1-12}$ cycloalkylene, $C_{1-12}$ substituted arylalkylene, or arylene group; and each $R^6$ is independently a substituted or unsubstituted $C_{1-12}$ alkylsilane, $C_{1-12}$ cycloalkylsilane, $C_{1-12}$ alkoxysilane, aryl substituted $C_{1-12}$ alkylsilane, a hydrogen, a vinyl, a substituted or unsubstituted $C_{1-12}$ alkyl, $C_{1-12}$ dialkylether, $(C_{1-12}$ cycloalkyl$)C_{1-12}$ alkylether, $C_{1-12}$ cycloalkyl, aryl substituted $C_{1-12}$ alkyl or aryl group.

3. The compound of claim 2 wherein the epoxide in $R^5$ is a cycloalkene oxide.

4. The compound of claim 2 wherein each $R^5$ is represented by the following structural formula:

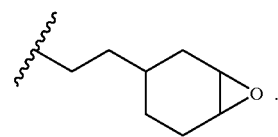

5. The compound of claim 2 wherein $R^1$ is a methyl group; each group $R^2$ is an ethylene, hexylene, or octylene group; each group $R^3$ is a methyl group; each group $R^4$ is a methyl group; each group $R^5$ is a 2-(3,4-epoxycyclohexyl) ethyl grouping, and each group $R^6$ is a hydrogen or ethenyl.

6. The compound represented by the following structural formula:

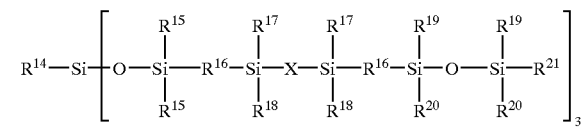

wherein $R^{14}$ is represented by a structural formula selected from:

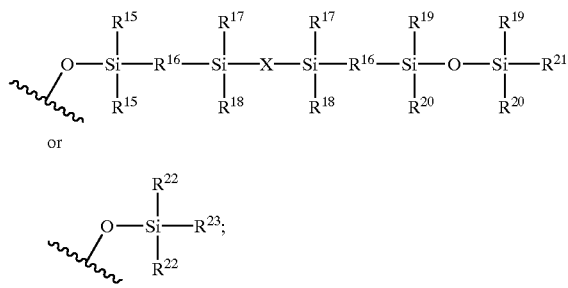

or each group $R^{15}$, each group $R^{17}$, each group $R^{18}$, each group $R^{19}$, each group $R^{20}$ and each group $R^{22}$ is independently a substituted or unsubstituted $C_{1-12}$ alkyl, $C_{1-12}$ cycloalkyl, aryl substituted $C_{1-12}$ alkyl or aryl group;

each group $R^{16}$ is independently a substituted or unsubstituted $C_{1-12}$ alkylene, $C_{1-12}$ cycloalkylene, $C_{1-12}$ arylalkylene, or arylene group, $-Y_1-[O-Y_1]_p-$, $-Y_1-Si(R^z)_2-Y_1-$, $-Y_1-Si(R^z)_2-Y_1-O-Y_1-Si(R^z)_2-Y_1-$, or $-Y_1-Si(R^z)_2-Y_1-Si(R^z)_2-Y_1-$;

each $R^{21}$ is independently an epoxide substituted aliphatic group having 2–10 carbon atoms;

$R^{23}$ is independently hydrogen, an alkenyl, a substituted or unsubstituted $C_{1-12}$ alkyl, $C_{1-12}$ cycloalkyl, aryl substituted $C_{1-12}$-alkyl or aryl or $R^z-(O-Y_1)_m-$, $(R^z)_3Si-(O-Si(R^z)_2)_q-Y_1-$ or $(R^z)_3Si-(O-Si(R^z)_2)_q-O-$;

each group X is independently oxygen or $R^{16}$;

each $R^z$ is independently a substituted or unsubstituted $C_{1-12}$ alkyl group, $C_{1-12}$ cycloalkylalkyl group, aryl substituted $C_{1-12}$ alkyl group or aryl group;

each $Y_1$ is independently a $C_{1-12}$ alkylene group;

p is an integer from 1 to 5; m is an integer from 1 to 10; and q is an integer from 0 to 4.

7. The compound of claim 6 wherein each group $R^{16}$ is independently a substituted or unsubstituted $C_{1-12}$ alkylene, $C_{1-12}$ cycloalkylene, aryl substituted $C_{1-12}$ alkylene or arylene group; $R^{23}$ is, independently, a hydrogen, a monovalent substituted or unsubstituted $C_{1-12}$ alkyl, $C_{1-12}$ dialkylether (alkyl-O-alkylene-), $C_{1-12}$ cycloalkyl $C_{1-12}$ alkylether, $C_{1-12}$ cycloalkyl, aryl substituted $C_{1-12}$ alkyl or aryl group; and X is oxygen.

8. The compound of claim 7 wherein the epoxide in $R^{21}$ is a cycloalkene oxide.

9. The compound of claim 8 wherein each is $R^{21}$ represented by the following structural formula:

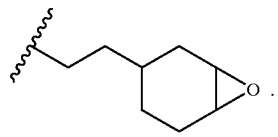

10. The compound of claim 9 wherein: each group $R^{15}$, $R^{17}$, $R^{18}$ $R^{19}$, $R^{20}$ and $R^{22}$ is a methyl group; each group $R^{16}$ is an ethylene, hexylene, or octylene group; and $R^{23}$ is a hydrogen, hexyl, or alkylether.

11. The holographic recording medium comprising:
(a) at last one polyfunctional epoxide monomer;
(b) a binder which is capable of supporting cationic polymerzation;
(c) and acid generator capable of producing an acid upon exposure to actinic radiation; and, optionally,
(d) a sensitizer, wherein the polyfunctional epoxide monomer is by the following structural formula:

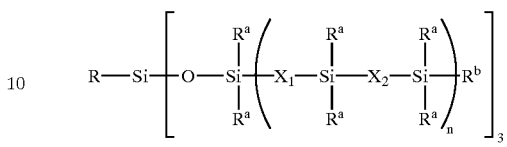

wherein:

$X_1$ and $X_2$ are independently each oxygen or a substituted or unsubstituted $C_{1-12}$ alkylene, $C_{1-12}$ cycloalkylene, $C_{1-12}$ arylalkylene, or arylene group, $-Y_1-[O-Y_1]_p-$, $-Y_1-Si(R^z)_2-Y_1-$, $-Y_1-Si(R^z)_2-Y_1-O-Y_1-Si(R^z)_2-Y_1-$, or $-Y_1-Si(R^z)_2-Y_1-Si(R^z)_2-Y_1-$;

each group $R^2$ is independently a substituted or unsubstituted $C_{1-12}$ alky group, $C_{1-12}$ cycloalkylalkyl group, aryl substituted $C_{1-12}$ alkyl group or aryl group;

each $Y_1$ is independently a $C_{1-12}$ alkylene group;

p is an integer from 1 to 5;

each $R^z$ is independently a substituted or unsubstituted aliphatic group or a substituted or unsubstituted aryl group;

n is 1, 2, 3 or 4;

R is a substituted or unsubstituted aliphatic group, a substituted or unsubstituted aryl group or is represented by a structural formula selected from:

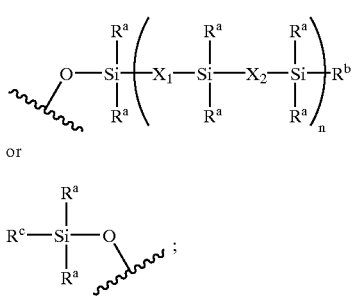

or each $R^b$ is independently an epoxide substituted aliphatic group; and $R^c$ is H, an unsubstituted aliphatic group, a substituted aliphatic group, an unsubstituted aryl group, a substituted aryl group, a substituted siloxane group, an unsubstituted siloxane group, a substituted polysiloxane group or an unsubstituted polysiloxane group.

12. The holographic recording medium of claim 11 wherein the polyfunctional epoxide monomer is represented by the following structural formula:

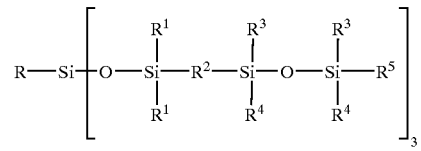

wherein R is represented by a structural formula selected from:

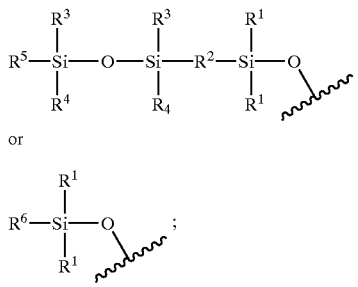

or wherein:
  each group $R^1$, each group $R^3$ and each group $R^4$ is independently a substituted or unsubstituted $C_{1-12}$ alkyl, $C_{1-12}$ cycloalkyl, aryl substituted $C_{1-12}$ alkyl or aryl group;
  each group $R^2$ is independently a substituted or unsubstituted $C_{1-12}$ alkylene, $C_{1-12}$ cycloalkylene, $C_{1-12}$ arylalkylene, or arylene group, $-Y_1-[O-Y_1]_p-$, $-Y_1-Si(R^z)_2-Y_1-$, $-Y_1-Si(R^z)_2-Y_1-O-Y_1-Si(R^z)_2-Y_1-$, or $-Y_1-Si(R^z)_2-Y_1-Si(R^z)_2-Y_1-$;
  each group $R^5$ is independently, an epoxide substituted aliphatic group having 2–10 carbon atoms; and
  each group $R^6$ is independently hydrogen, an alkenyl, a substituted or unsubstituted $C_{1-12}$ alkyl, $C_{1-12}$ cycloalkyl, aryl substituted $C_{1-12}$-alkyl or aryl or $R^z-(O-Y_1)_m-$, $(R^z)_3Si-(O-Si(R^z)_2)_q-Y_1-$ or $(R^z)_3Si-(O-Si(R^z)_2)_q-O-$;
  each $R^z$ is independently a substituted or unsubstituted $C_{1-12}$ alkyl group, $C_{1-12}$ cycloalkylalkyl group, aryl substituted $C_{1-12}$ alkyl group or aryl group;
  each $Y_1$ is independently a $C_{1-12}$ alkylene group;
  p is an integer from 1 to 5; m is an integer from 1 to 10; and q is an integer from 0 to 4.

13. The holographic recording medium of claim 12 wherein each group $R^2$ is independently, a substituted or unsubstituted $C_{1-12}$ alkylene, $C_{1-12}$ cycloalkylene, aryl substituted $C_{1-12}$ alkylene, or arylene group each $R^6$ is independently a monovalent substituted or unsubstituted $C_{1-12}$ alkylsilane, $C_{1-12}$ cycloalkylsilane, $C_{1-12}$ alkoxysilane, aryl substituted $C_{1-12}$ alkylsilane, a hydrogen, a vinyl, a monovalent substituted or unsubstituted $C_{1-12}$ alkyl, $C_{1-12}$ dialkylether, $(C_{1-12}$ cycloalkyl$)C_{1-12}$ alkylether, $C_{1-12}$ cycloalkyl, aryl substituted $C_{1-12}$ alkyl or aryl group.

14. The holographic recording medium of claim 13 wherein the epoxide in $R^5$ is a cycloalkene oxide.

15. The holographic recording medium of claim 14 wherein each $R^5$ is represented by the following structural formula:

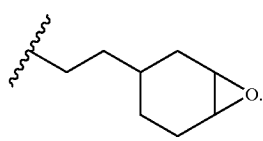

16. The holographic recording medium of claim 15 wherein $R^1$ is a methyl group; each group $R^2$ is an ethylene, hexylene, or octylene group; each group $R^3$ is a methyl group; each group $R^4$ is a methyl group; each group $R^5$ is a 2-(3,4-epoxycyclohexyl)ethyl grouping, and each group $R^6$ is a hydrogen or ethenyl.

17. The holographic recording medium of claim 11 wherein the polyfunctional epoxide monomer is represented by the following structural formula:

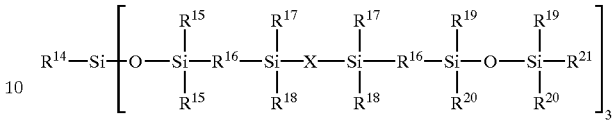

wherein $R^{14}$ is represented by a structural formula selected from:

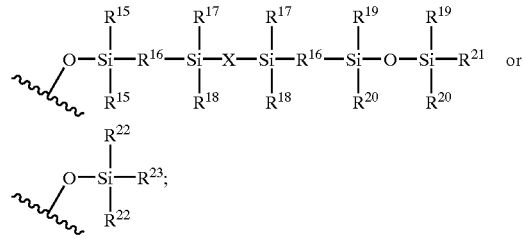

each group $R^{15}$, each group $R^{17}$, each group $R^{18}$, each group $R^{19}$, each group $R^{20}$ and each group $R^{22}$ is independently a substituted or unsubstituted $C_{1-12}$ alkyl, $C_{1-12}$ cycloalkyl, aryl substituted $C_{1-12}$ alkyl or aryl group;
  each group $R^{16}$ is independently a substituted or unsubstituted $C_{1-12}$ alkylene, $C_{1-12}$ cycloalkylene, $C_{1-12}$ arylalkylene, or arylene group, $-Y_1-[O-Y_1]_p-$, $-Y_1-Si(R^z)_2-Y_1-$, $-Y_1-Si(R^z)_2-Y_1-O-Y_1-Si(R^z)_2-Y_1-$, or $-Y_1-Si(R^z)_2-Y_1-Si(R^z)_2-Y_1-$;
  each $R^{21}$ is independently an epoxide substituted aliphatic group having 2–10 carbon atoms;
  $R^{23}$ is independently hydrogen, an alkenyl, a substituted or unsubstituted $C_{1-12}$ alkyl, $C_{1-12}$ cycloalkyl, aryl substituted $C_{1-12}$-alkyl or aryl or $R^z-(O-Y_1)_m-$, $(R^z)_3Si-(O-Si(R^z)_2)_q-Y_1-$ or $(R^z)_3Si-(O-Si(R^z)_2)_q-O-$;
  each group X is independently oxygen or $R^{16}$;
  each $R^z$ is independently a substituted or unsubstituted $C_{1-12}$ alkyl group, $C_{1-12}$ cycloalkylalkyl group, aryl substituted $C_{1-12}$ alkyl group or aryl group;
  each $Y_1$ is independently a $C_{1-12}$ alkylene group;
p is an integer from 1 to 5; m is an integer from 1 to 10; and q is an integer from 0 to 4.

18. The holographic recording medium of claim 17 wherein each group $R^{16}$ is independently a substituted or unsubstituted $C_{1-12}$ alkylene, $C_{1-12}$ cycloalkylene, $C_{1-12}$ arylalkylene or arylene group; $R^{23}$ is, independently, a hydrogen, a monovalent substituted or unsubstituted $C_{1-12}$ alkyl, $C_{1-12}$ dialkylether (alkyl-O-alkylene-), $C_{1-12}$ cycloalkyl $C_{1-12}$ alkylether, $C_{1-12}$ cycloalkyl, aryl substituted $C_{1-12}$ alkyl or aryl group; and X is oxygen.

19. The holographic recording medium of claim 18 wherein the epoxide in $R^{21}$ is a cycloalkene oxide.

20. The holographic recording medium of claim 19 wherein each is $R^{21}$ represented by the following structural formula:

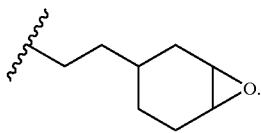

21. The holographic recording medium of claim 20 wherein each group $R^{15}$, $R^{17}$, $R^{18}R^{19}$, $R^{20}$ and $R^{22}$ is a methyl group; each group $R^{16}$ is an ethylene, hexylene, or octylene group; and $R^{23}$ is a hydrogen, hexyl, or alkylether.

22. The holographic recording medium of claim 11 additionally comprising a difunctional epoxide monomer.

23. The holographic recording media of claim 22 wherein the difunctional epoxide monomer is represented by the following structural formula:

$$R^{24}Si(R^{25})_2OSi(R^{26})_2R^{24}$$

where each group $R_{24}$ is a 2-(3,4-epoxycyclohexyl)ethyl grouping; each grouping $R^{25}$ is a methyl group, and each group $R^{26}$ is a methyl group.

24. The holographic recording medium of claim 22 wherein the holographic medium comprises between about 0.25 to about 5 parts by weight of the difunctional epoxide monomer per part by weight of the polyfunctional epoxide monomer.

25. The holographic recording medium of claim 22 wherein the holographic medium comprises from about 90 parts binder and 10 parts monomer or oligomer (w/w) to about 10 parts binder and 90 parts monomer or oligomer (w/w).

26. The holographic recording medium of claim 11 wherein the acid generator capable of producing an acid upon exposure to actinic radiation is a diaryliodonium salt.

27. A holographic recording medium of claim 11 wherein the sensitizer is 5,12-bis(phenylethynyl)naphthacene.

28. The holographic recording medium of claim 11, additionally comprising a monofunctional epoxide monomer.

* * * * *

UNITED STATES PATENT AND TRADEMARK OFFICE
CERTIFICATE OF CORRECTION

PATENT NO. : 6,784,300 B2
DATED : August 31, 2004
INVENTOR(S) : Erdem A. Cetin, Richard A. Minns and David A. Waldman It is certified that error appears in the above-identified patent and that said Letters Patent is hereby corrected as shown below:

Column 23,
Line 34, delete "is".

Column 25,
Line 64, delete "The" and insert -- A --.

Column 26,
Line 5, after "is", insert -- represented --.
Line 22, delete "$R^2$", and insert -- $R^z$ --.
Line 28, delete "$R^z$", and insert -- $R^a$ --.

Signed and Sealed this

Seventh Day of December, 2004

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,784,300 B2 | Page 1 of 1 |
| APPLICATION NO. | : 09/941166 | |
| DATED | : August 31, 2004 | |
| INVENTOR(S) | : Erdem A. Cetin, Richard A. Minns and David A. Waldman | |

It is certified that error appears in the above-identified patent and that said Letters Patent is hereby corrected as shown below:

Column 25

Line 65, delete "last" and insert --least--.

Column 26

Line 1, delete "and" and insert --an--.

Signed and Sealed this

Twenty-sixth Day of February, 2008

JON W. DUDAS
*Director of the United States Patent and Trademark Office*